United States Patent [19]
Ikeda et al.

[11] Patent Number: 5,091,694
[45] Date of Patent: Feb. 25, 1992

[54] QUARTZ PROBE APPARATUS

[75] Inventors: Towl Ikeda, Kofu; Hisashi Koike, Yamanashi, both of Japan

[73] Assignee: Tokyo Electron Limited, Tokyo, Japan

[21] Appl. No.: 472,228

[22] Filed: Jan. 30, 1990

[30] Foreign Application Priority Data

| Jan. 31, 1989 | [JP] | Japan | 1-22085 |
| May 15, 1989 | [JP] | Japan | 1-121076 |
| Aug. 21, 1989 | [JP] | Japan | 1-214464 |
| Oct. 5, 1989 | [JP] | Japan | 1-261007 |
| Nov. 16, 1989 | [JP] | Japan | 1-297990 |

[51] Int. Cl.$^5$ .................... G01R 1/02; G01R 1/067
[52] U.S. Cl. .................. 324/158 P; 324/72.5; 324/158 F
[58] Field of Search ........... 324/72.5, 158 P, 158 F; 333/238; 29/842, 843; 357/68, 71

[56] References Cited

U.S. PATENT DOCUMENTS

| 3,984,620 | 10/1976 | Robillard et al. | 324/158 F |
| 4,055,805 | 10/1977 | Ardezzone | 324/158 F |
| 4,551,746 | 11/1985 | Gilbert et al. | 357/74 |
| 4,585,727 | 4/1986 | Reams | 324/158 P |
| 4,593,243 | 6/1986 | Lao et al. | 333/238 |
| 4,649,338 | 3/1987 | Dugan | 324/158 P |
| 4,727,319 | 2/1988 | Shahriary | 324/72.5 |
| 4,824,073 | 4/1989 | Zdeblick | 357/26 |
| 4,851,794 | 7/1989 | Williams et al. | 324/158 P |
| 4,853,627 | 8/1989 | Gleason et al. | 324/158 P |
| 4,895,705 | 1/1990 | Wrighton et al. | 324/663 |

FOREIGN PATENT DOCUMENTS

| 0259162 | 3/1988 | European Pat. Off. | 324/158 P |
| 54-43354 | 12/1979 | Japan . | |
| 58-32782 | 7/1983 | Japan . | |
| 0118774 | 5/1989 | Japan | 324/158 P |
| 6311725 | 5/1990 | Japan . | |

OTHER PUBLICATIONS

Quartz Probing Card, manufactured by Tokyo Electron Copes with Narrow Pitch Pad with New Concept.

Primary Examiner—Kenneth A. Wieder
Assistant Examiner—William J. Burns
Attorney, Agent, or Firm—Oblon, Spivak, McClelland, Maier & Neustadt

[57] ABSTRACT

A quartz probe apparatus having a plurality of quartz probe bodies and a metal pattern layer formed on each of the quartz probe bodies. A plurality of quartz probe bodies integrally incorporate a microprobe portion including a number of microprobes corresponding to electrode arrays of an object of examination, a pattern wiring portion connected with the microprobe portion, and an electrode pad portion connected with the pattern wiring portion. A plurality of quartz probe bodies are formed by etching a Z-plane of a quartz plate perpendicular to the crystal axis Z thereof.

11 Claims, 8 Drawing Sheets

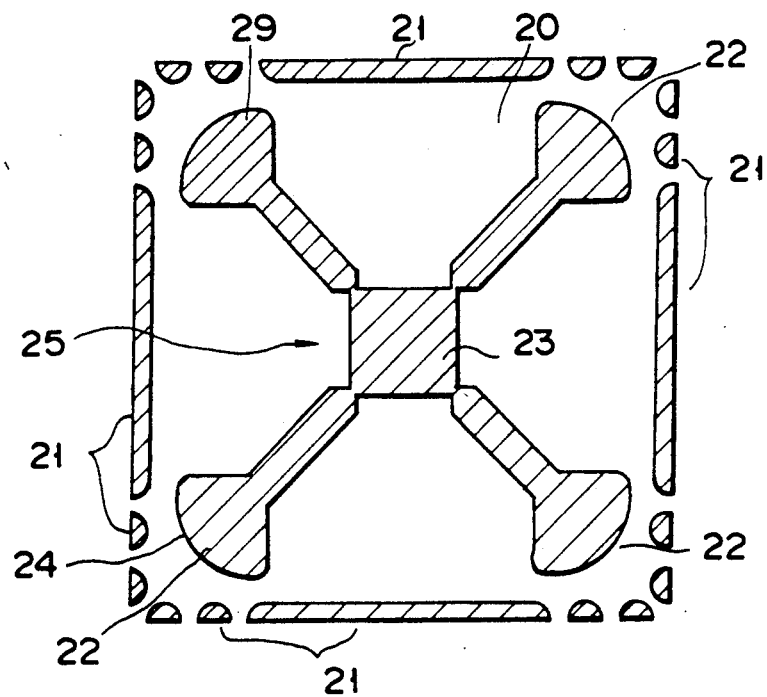
F I G. 2
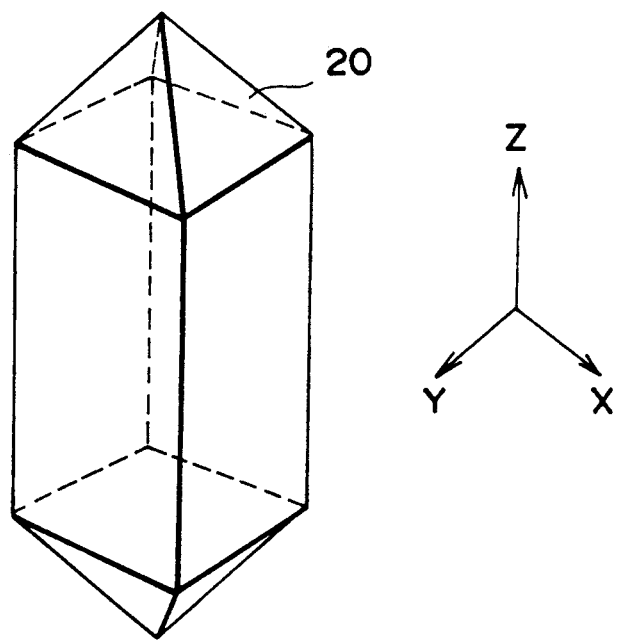
F I G. 3

QUARTZ PROBE APPARATUS

BACKGROUND OF THE INVENTION

1. Field of the Invention

The present invention relates to a quartz probe apparatus, and more particularly, to a quartz probe apparatus capable of being easily aligned with an object of examination.

2. Description of the Related Art

A number of electrode pads are formed on a semiconductor device, such as an IC, and a probe apparatus is used to examine the electrical properties of the semiconductor device. A wafer probe apparatus is also used for testing the electrical properties of the semiconductor device in the form of a wafer. In this probe apparatus, a number of microprobes are arranged corresponding to the electrode pad arrays of the semiconductor device, on an insulated substrate. A probe card is conventionally used for the examination (Published Examined Japanese Patent Application Nos. 54-43354, 58-32782, etc.). In this probe card, a number of microprobes are fixedy arranged at fine pit.ches on an insulated support so that the microprobes can be in contact with a number of electrode pads formed at the peripheral portion (usually, four sides) of an IC.

Conventionally, however, the microprobes are manually arranged on the insulated support, and this manual work is very troublesome. Lately, the technology for fine processing of the semiconductor device has advanced, and accordingly the degree of integration of a semiconductor device has improved. For example, some hundred IC chips are formed on a 6 inches semiconductor wafer. The size of a chip is as large as 5 square mm, and a row of some hundred electrode pads is formed on each side of a chip. As the degree of integration of a semiconductor device improves, the number of the electrode pads increases, accordingly. Thus recently, electrode pads having the size of 60 square $\mu$m to 80 square $\mu$m are arranged on a side of a chip with an arrangement pitch of 20 to 50 $\mu$m. Some hundred microprobes which the diameter of each distal end is 30 $\mu$m, need to be simultaneously brought into contact wit electrode pads such as above.

Meanwhile, tungsten probes for use as conventional microprobes are manufactured by drawing tungsten. Currently, therefore, the diameter of tungsten can be reduced at most to 100 $\mu m\phi$. Consequently, in the case where tungsten is used as the microprobes, the diameter is wider than 100 $\mu m\phi$. Thus, the microprobes manufactured by the conventional method cannot cope with the demand for higher-density semiconductors.

A quartz probe apparatus is a promising probe card of a new type. It is manufactured using the IC manufacturing technique which enables fine processing. According to this method, a quartz plate is etched to form a number of fine-pitch microprobes and electrodes simultaneously. Quartz is selected as the material of the microprobes for the following reasons.

(1) Since quartz permits anisotropic etching, overetching and side etching can be minimized.

(2) Since the technique used is established in the manufacture of vibrators, the production is steady.

(3) Since quartz has a high modulus of elasticity, it can absorb the unevenness of the electrode pads.

(4) Since quartz has a constant modulus of elasticity, the microprobes suffer less fatigue after repeated use.

In the conventional method for manufacturing the quartz probe apparatus, a plurality of probe bodies, which correspond individually to electrode pads arranged along one side of an IC, are formed on one quartz plate by etching. FIG. 1 is a plan view of the quartz plate on which the probe bodies are formed. In FIG. 1, numeral 1 denotes the quartz plate. Probe bodies 2 and 3 of different sizes are formed by etching quartz plate 1. Prob bodies 2 and 3 include microprobe portions 2a and 3a having a number of microprobes of fine pitches in contact with the electrode pads of the IC, electrode pad portions 2b and 3b formed on the other end side of bodies 2 and 3, and wiring pattern portions 2c and 3c connecting microprobe portions 2a and 3a and electrode pad portions 2b and 3b, respectively. The respective longitudinal straight portions of microprobe portions 2a and 3a and electrode pad portions 2b and 3b extend along the crystal axis of Y-axis of quartz plate 1.

Subsequently, a metal pattern layer is formed on each of probe bodies 2 and 3. Thereafter, probe bodies 2 or 3 of the same type are combined in sets of four, and each set is fixed to a mother board (not shown). In fixing the probe bodies to the mother board, the probe bodies are accurately aligned so that their respective microprobes ar individually in contact with the electrode pads of the IC.

Thus, according to the quartz probe apparatus described above, the fine-pitch arrangement of the microprobe portions can be achieved with ease. The high-accuracy alignment work, however, requires much time and labor.

SUMMARY OF THE INVENTION

Accordingly, the object of the present invention is to provide a quartz probe apparatus in which microprobe portions are arranged at fine pitches, and each probe can be easily aligned with each electrode pad of an object of examination.

According to the present invention, there is provided a quartz probe apparatus which comprises: a plurality of quartz probe bodies formed by etching a Z-plane of a quartz plate perpendicular to the crystal axis Z thereof and integrally incorporating a microprobe portion having a number of microprobes corresponding to electrode arrays of an object of examination, a pattern wiring portion connected with the microprobe portion, and an electrode pad portion connected with the pattern wiring portion; and a metal pattern layer formed on each of the quartz probe body.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention:

FIG. 2 is a schematic view for illustrating an example of a probe body of a quartz probe apparatus according to the present invention;

FIG. 3 is a schematic view of a crystal of quartz;

DETAILED DESCRIPTION OF THE PREFERRED EMBODIMENTS

Figure 1:
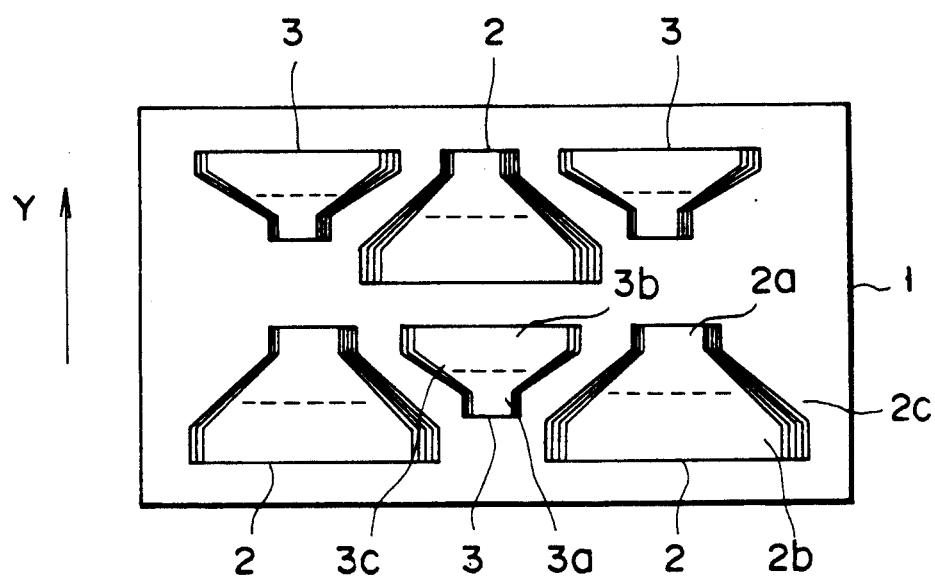
FIG. 1 shows a conventional etching pattern used to manufacture a quartz probe apparatus.

A quartz probe apparatus according to an embodiment of the present invention will now be described in detail with reference to the accompanying drawings.

First, the construction of a quartz probe apparatus according to the embodiment of the invention will be described in conjunction with processes of its manufacture.

FIG. 2 is a plan view showing the quartz probe apparatus according to the embodiment is manufactured using one quartz plate.

In FIG. 2, the crystal axis Z of quartz plate 20 corresponds to its etching direction, that is, from the obverse of the drawing to the reverse. An X—Y plane (Z-plane), which is defined by crystal axes X and Y extending at right angles to the axis Z, is an etching plane. The thickness of quartz plate 20 is necessary to be adjusted such that a microprobe formed by etching can enjoy satisfactory elasticity and strength. Preferably, the thickness of plate 20 ranges from 50 to 130 μm for productivity.

The etching speeds of quartz in the directions of the X-, Y-, and Z-axes are related as follows:

$$X:Y:Z=6:1:100.$$

In FIG. 3, numeral 20 designates the shape of a quartz crystal, and the X-, Y-, and Z-axis directions correspond to the directions of the optical axis, electrical axis, and chemical axis, respectively.

As seen from the above relationships, the etching speed in the Z-axis direction is much higher than the speeds in the X- and Y-axis directions. Accordingly, the etching advances faster in the Z-axis direction than in the other directions.

An etching solution used in the etching of the quartz may be a mixed solution, containing hydrofluoric acid, nitric acid, pure water, glycerin, a surface active agent, such as sodium dodecylsulfate (SDS), etc., or an aqueous solution of ammonium fluoride. Dry etching by means of plasma etching may be used in place of such wet etching In FIG. 2, numerals 21 to 23 designate regions (hereinafter referred to as etching regions) to be removed by etching. Etching regions 21 are discontinuously formed along the contour of a square. The external shape of the body of the probe is determined by cutting along the contour after the etching. Thus, four etching regions 22 are formed along the diagonals of the square. These portions constitute bent notch portions 24 mentioned later. Square central etching region 23 connects with four etching regions 22 at their four corners. Microprobe portions 25 are formed along on the peripheral edge portion of etching region 23 by etching.

Figure 4:
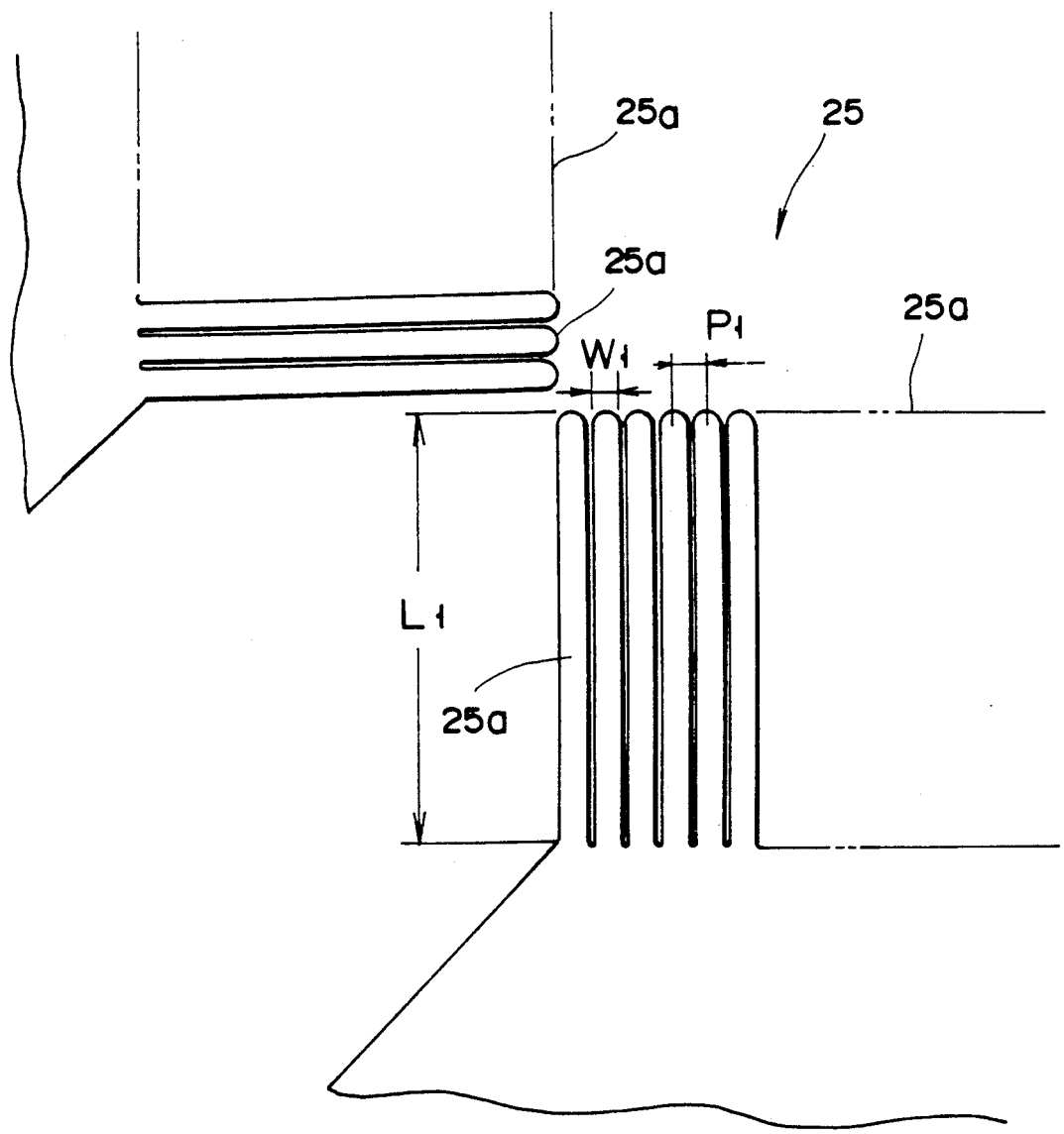
FIG. 4 a partial enarged view of the pattern shown in FIG. 1.

Referring now to FIG. 4, microprobe portions 25 will now be described in detail.

As shown in FIG. 4, each microprobe portion 25 is formed of a number of strip-shaped microprobes 25a. Microprobes 25a formed along each one side of the probe body are as many as electrode pads on each side of an IC (not shown) which is the object of examination. Pitch P1 between each two adjacent microprobes 25a, which depends on the number of electrodes on each side of the IC, ranges from 30 to 110 μm. Width W1 of each microprobe 25a ranges from 20 to 100 μm. Length L1 of each microprobe 25a is necessary to be adjusted so that the microprobes have elasticity enough to fully absorb the differences in height between the electrodes and have strength enough to stand repeated use. Preferable, length L1 ranges from 1.5 to 2.5 mm. For example, pitch P1, width W1, and length L1 may be 70 μm, 54 μm, and 1.8 mm, respectively.

The quartz probe body is obtained by outline cutting along etching regions 21 after the end of the etching process for quartz plate 20. An electrode pattern is formed by subjecting the obtained probe body to sputtering and plating.

Figure 5:
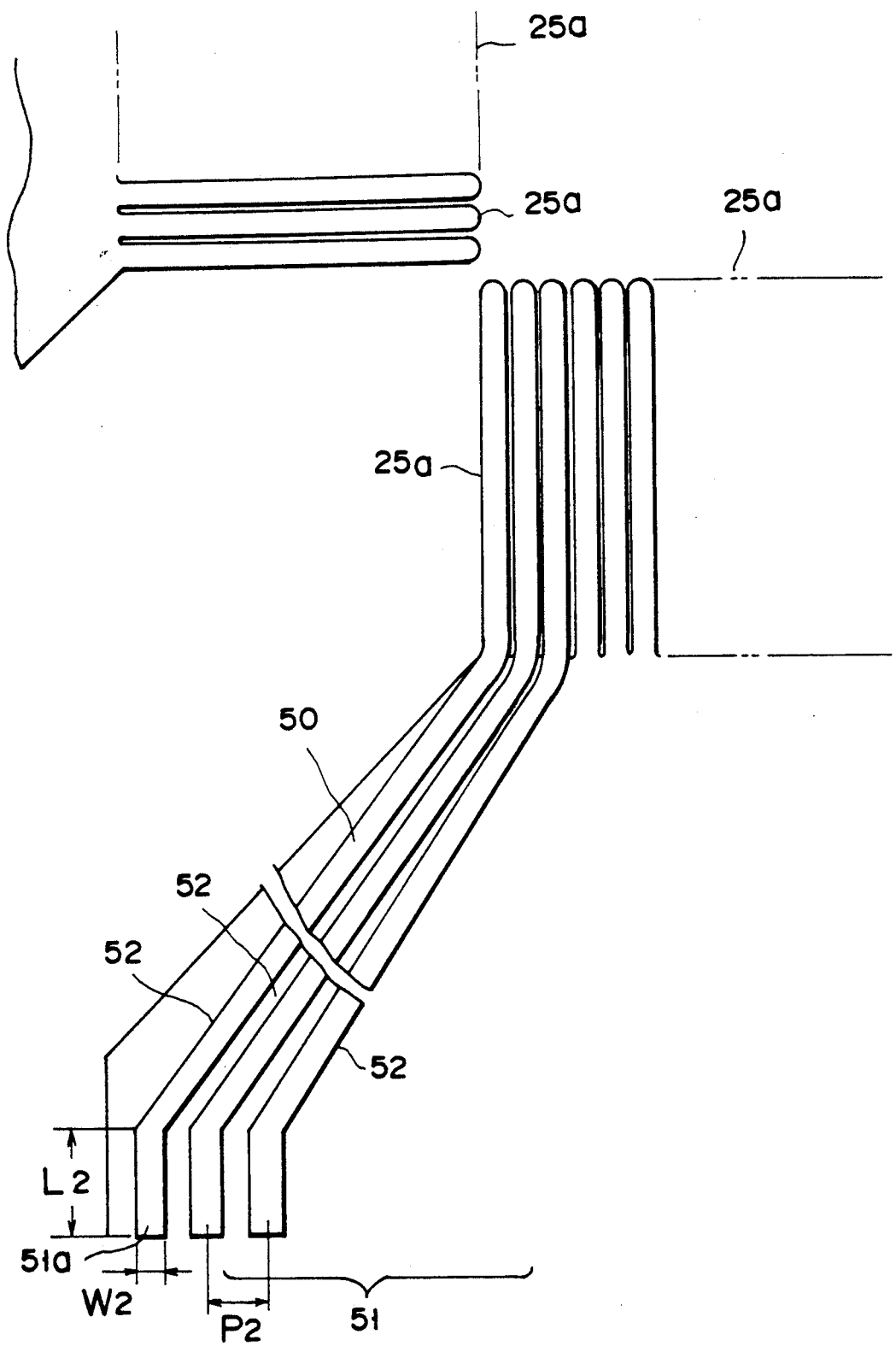
FIG. 5 is a schematic view for illustrating metal layers formed on a quartz plate.

More specifically, metal layer 50 is formed corresponding to each microprobe 25a on the quartz probe body, as shown in FIG. 5. In each metal layer 50, each electrode pad 51a arranged at the peripheral edge portion of quartz plate 20 and each microprobe 25a are connected electrically to each other by means of pattern wiring 52a. Electrode pad portion 51 is formed of electrode pads 51a which are as many as microprobes 25a. Pitch P2 between each two adjacent electrode pads 51a, length L2 of each pad, and width W2 of each pad are 200 μm, 150 μm, and 50 μm, respectively, for example. In order to make pitch P2 greater than pitch P1 between microprobes 25a, pattern wiring portion 52 is spread in the form of a fan.

Figure 6:
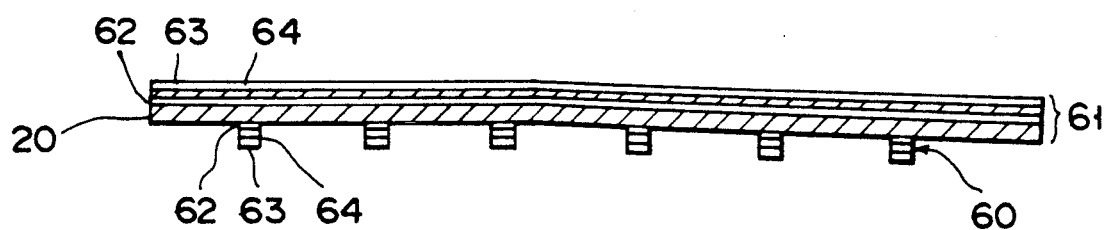
FIG. 6 is a sectional view showing microstrip lines formed on the quartz plate.

Metal layer 50 constitutes a microstrip line structure. As shown in FIG. 6, the microstrip line structure is composed of patterned lead strip lines 60 formed on one side of quartz plate 20 and ground strip line 61 formed on the other side of plate 20.

As shown in FIG. 5, the pattern of lead strip lines 60 is formed so that strip lines 60, which correspond individually to the electrode pads of the IC (not shown), are insulated independently from one another. In principle, individual lead strip lines 60 have the same width and length, in order to prevent a signal deviation (skew between signals) attributable to difference in the strip line length. Preferably, the width of strip lines for power supply is greater than that of lines for signal transmission. In order to prevent reflection of transmitted waves, each lead strip line 60 must to be made free of any angled portions. For example, the angled portion connecting straight lines may be a smoothly curved tangential portion, or the tip end of each line 60 may be rounded.

Lead strip lines 60 and ground strip line 61 may, for example, be obtained by forming the following multiple metal layer on quartz plate 20. The multiple metal layer is made in the following manner. First, chromium 62, which is wettable with quartz, is deposited to a thickness of e.g. 500 Å on plate 20 by sputtering. Thereafter, gold 63 is deposited to a thickness of e.g. 500 Å on the chromium layer by sputtering. Finally, plating layer 64 of gold is deposited to a thickness of several micrometers to tens of micrometers. The chromium and gold layers formed by sputtering serve as primary layers, while the gold layer finally formed by plating serves as an electrically conductive layer. The metal material for the conductive layer may be any other good electric conductor, such as silver or copper in the place of gold. The chromium and gold layers of 500 Å thickness may be deposited by vacuum evaporation, as well as by sputtering.

The multiple metal layer of ground strip line 61 is formed in the same manner as that of lead strip line 60. It is to be understood that the multiple metal layers of strip lines 61 and 60 may be simultaneously formed on the opposite sides of quartz plate 20.

Thereafter, the multiple metal layer on the lead strip line side is patterned by conventional photolithography. Ground strip line 61 is connected to the ground potential. The microstrip line structure obtained in this manner can be used to manufacture the quartz probe apparatus with a satisfactory high frequency characteristic which ensures a stable characteristic impedance.

Figure 7:
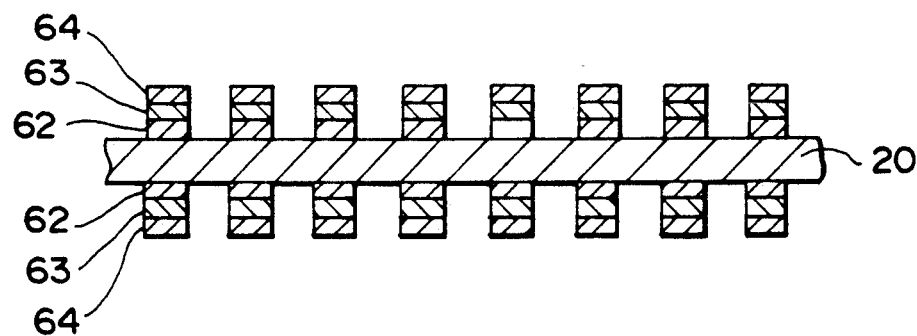
FIG. 7 is a sectional view showing microstrip lines formed identical patterns on the opposite sides of the quartz plate.

Although ground strip line 61 is not patterned in FIG. 6, it may alternatively be patterned. Strain of the strip lines attributable to temperature change can be made equal by using identical patterns 70 and 71 for lead strip lines 60 and ground strip lines 61, as shown in FIG. 7. Thus, the microprobe can be prevented from being deformed by differences in strain between the strip lines.

Figure 8:
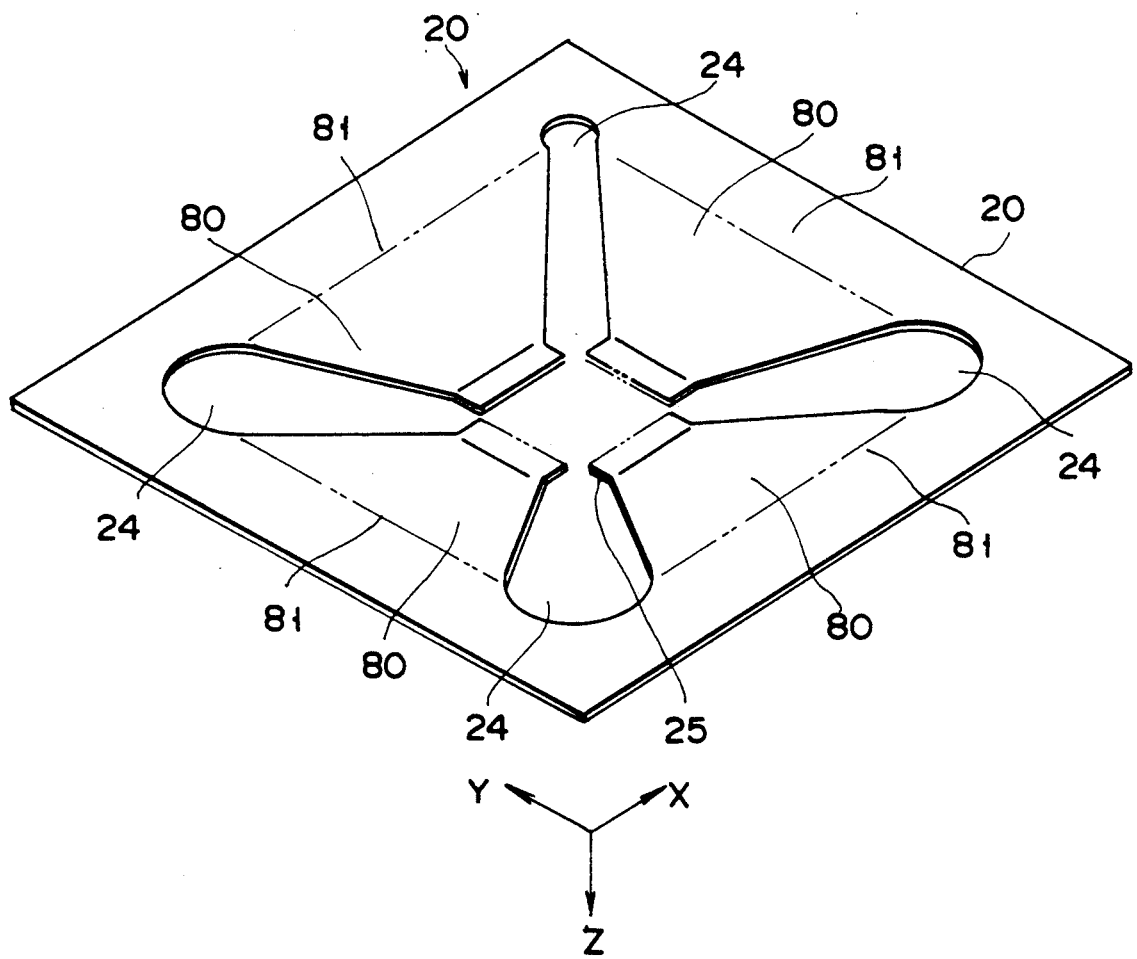
FIG. 8 is a perspective view for illustrating quartz probes obtained after etching and bending processes.

After metal layers 50 are formed on the probe body, the resulting structure is bent, as shown in FIG. 8.

Four pattern wiring portions 80 decline to the microprobe side, at an angle of about 5° to 15°. Four microprobe portions 81 extend parallel to their corresponding peripheral level surface portions of quartz plate 20, and are on the lower level than the peripheral level surface portions. The bending process can be easily effected, since bent notch portions 24, defined by etching regions 22 shown in FIG. 2, are on the diagonals of quartz plate 20.

The electrode pads of the IC, as the object of examination, are connected to microprobe portions 81 on the lower level of quartz plate 20 shown in FIG. 8 when they are examined. Since a number of ICs are formed on a semiconductor wafer, only microprobe portions 81 are situated below the other portions, in order to prevent pattern wiring portions 80 from touching the electrode pads of the other ICs which are not subjected to the examination.

The quartz probe, constructed in this manner, is fixed and wired to a mother board (not shown) and is fixedly supported over a table for carrying the IC as the object of examination. The quartz probe apparatus is constructed in this manner. In this quartz probe apparatus, the microprobe portions which correspond to all the electrode pads of one object of examination are integrally formed on one quartz plate, so that there is no necessity for the troublesome alignment of the probe bodies with the rows of electrode pads on the four sides.

A flexible printed circuit board (FPC) may be arranged directly on the pattern wiring portions as wiring for the individual electrode pad portions of quartz plate 20.

Figure 9:
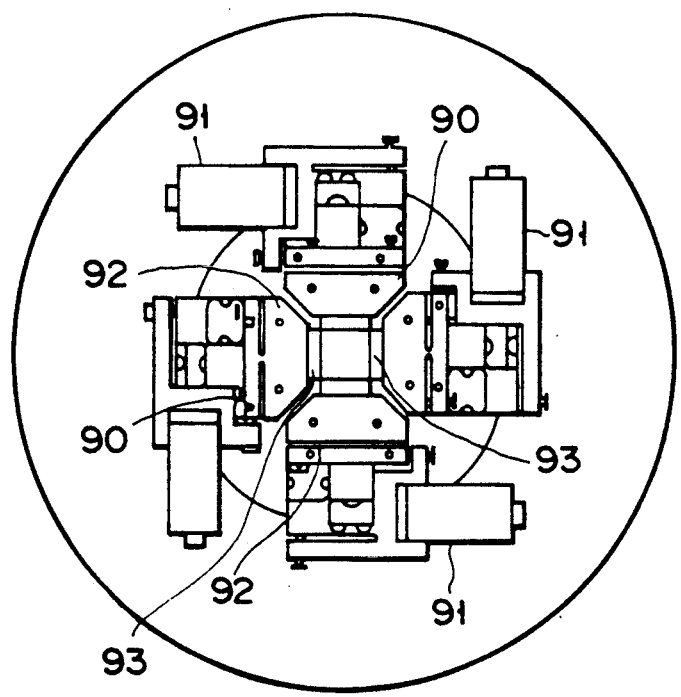
FIG. 9 is a diagram for illustrating aligning means used in manufacturing the quartz probe apparatus.

In the present embodiment, the microprobe portions which correspond to all the electrode pads of one object of examination are integrally formed on one quartz plate. Alternatively, however, the probe body having microprobe portions may be separately formed and arranged with use of an aligning means. More specifically, the positions of four quartz probe bodies 93 may be adjusted by means of X- and Y-axis adjusting members 90, Z-axis adjusting members 91, and θ-axis adjusting members 92, utilizing screw connections, as shown in FIG. 9.

Figure 10:
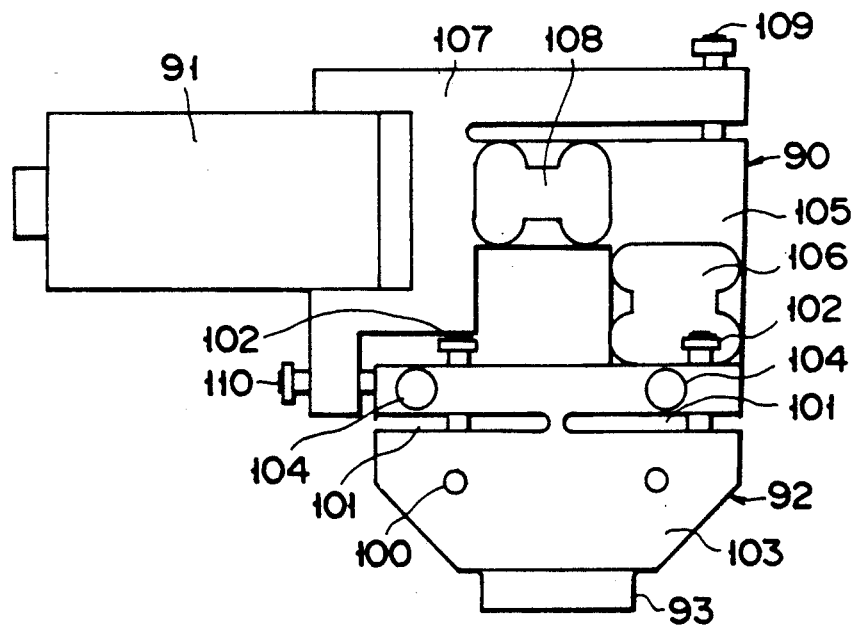
FIG. 10 is a plan view showing an example of the aligning means.

FIG. 10 shows the aligning means utilizing screw connections. Planar θ-axis adjusting member 92 is fixed to the top surface of a support (not shown) by means of pins 100. Slit 101 extends from a predetermined portion of each opposite end face of adjusting member 92 toward the center thereof so that the central portion of member 92 remains continuous. Further, θ-axis adjusting screws 102 are screwed into θ-axis adjusting member 92 from one of the slitless end portions thereof. If screws 102 are turned, movable block 103 of adjusting member 92 rocks, thereby effecting adjustment in the θ-axis direction.

X- and Y-axis adjusting member 90 is connected to θ-axis adjusting member 92 by means of connecting pins 104. Adjusting member 90 includes X-axis adjusting portion 106 and Y-axis adjusting portion 108, which have through holes 105 and 107, respectively. Thus, X-and Y-axis adjusting member 90 constitutes a parallel link mechanism. The X-axis adjustment is achieved by moving X-axis adjusting portion 105 in the X-axis direction by means of X-axis adjusting screw 109, which is engaged with adjusting portion 105. The Y-axis adjustment is achieved by moving Y-axis adjusting portion 107 in the Y-axis direction by means of Y-axis adjusting screw 110, which is engaged with adjusting portion 107.

Further, Z-axis adjusting member 91 is attached to X- and Y-axis adjusting member 90, thus constituting a parallel link mechanism. The Z-axis adjustment is achieved by adjusting a pressure applied to adjusting member 91. In adjusting this pressure, a Z-axis adjusting screw (not shown) is turned to move a taper cam.

In this manner, the positions of four quartz probe bodies 93 can be adjusted.

Although the four axes, including the X-, Y-, Z-, and θ-axes, are adjusted in the aforementioned example, six axes, including three moving axes and three rotating axes, may be adjusted instead. In the above example, moreover, the adjusting members are provided separately for the X-, Y-, Z-, and &H -axes. Alternatively, however, all the axial directions may be adjusted by means of only one unit.

By the use of such an adjusting means, backlash between the individual probe bodies, that is, a difference in level between the probes, can be prevented. Thus, the microprobes between the probe bodies can be brought together into contact with all the electrode pads of the object of examination.

Figure 11:
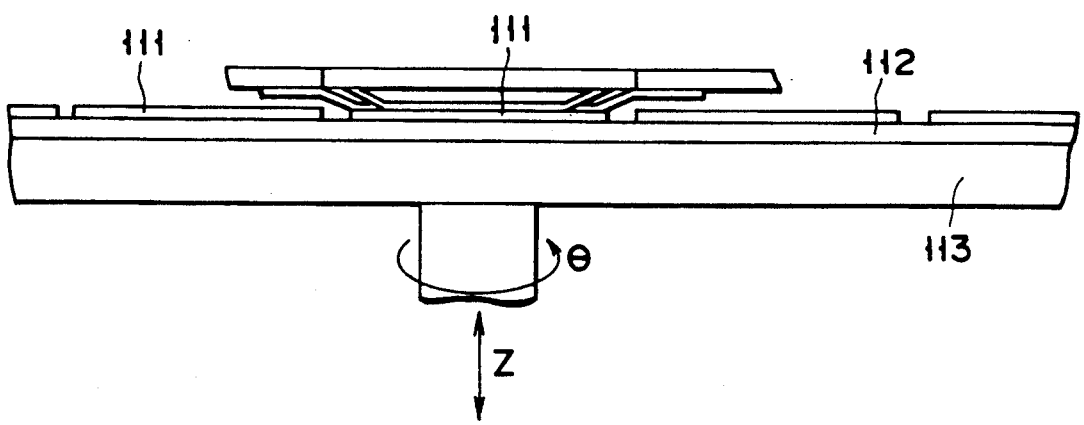
FIG. 11 is a diagram for illustrating a probing examination using the quartz probe apparatus of the invention.

The examination using this quartz probe apparatus is conducted in a manner such that semiconductor wafer 112, which is formed of a number of ICs 111 as objects of examination, is placed on table 113 below the quartz probe apparatus, as shown in FIG. 11. As table 113 is raised in the Z-direction of FIG. 11, all the electrode pads on the four sides of one IC 111 are brought together into contact with the microprobe portions of four groups. Table 113 is movable in the θ-axis direction around the Z-axis and in the X- and Y-axis directions perpendicular to the Z-axis. As table 113 moves in the θ-, X-, and Y-axis directions an aligning operation can be performed such that the electrode pads of IC 111 are accurately in contact with the microprobes of the quartz probe apparatus.

In the quartz probe apparatus according to the embodiment described above, strip-shaped microprobe portions 25 of fine pitches can be easily constructed corresponding to the fine pad pitches of the modern high-density ICs. The fine pitches of strip-shaped microprobe portions 25 can be secured by etching. The etching advances only in the direction of the thickness of quartz plate 20, that is, in the Z-direction perpendicular to the X-Y plane (Z-plane) which contains no Z-axis component corresponding to the etching direction. Thus, etching regions 21 to 23 formed on quartz plate 20 and fine-pitch, strip-shaped microprobe portions 25 can be accurately etched.

Since microprobe portions 25 are strip-shaped and flexible, they can be securely brought together into contact with the pads of IC 111 even though the pads are somewhat uneven.

In the quartz probe apparatus of the embodiment shown in FIG. 7, the positioning accuracy of microprobe portions 25 relative to all the electrode pads of IC 111 as the object of examination can be considerably improved. Since a plurality of groups of microprobe portions 25, which correspond to all the electrode pads on the four sides of the IC, are integrally formed on the X—Y plane (Z-plane) of quartz plate 20 by etching so that portions 25 are connected to the one quartz plate, the positional relationships between four microprobe portions 25 are definitely decided after the etching. Thus, the quartz probe apparatus has an advantage in requiring no manual alignment at all. Accordingly, this apparatus does not require any expert's manual work, and the omission of the manual alignment leads to a reduction of manufacturing time. In consequence, the manufacturing cost of the apparatus can be considerably reduced.

Thus, according to the quartz probe apparatus of this embodiment described above, the fine pitches of the microprobe portions can be secured with ease, and also, the positioning accuracy of microprobes with respect to the electrode pads on the four sides of the IC can be considerably improved. In consequence, the electrode pads can be securely brought into contact with the microprobes.

It is to be understood that the present invention is not limited to the embodiment described above, and that various changes and modifications may be effected therein by one skilled in the art without departing from the scope or spirit of the invention.

In order to form the microprobe portions of the fine pitches, it is necessary only to select, as the etching plane of the quartz plate, X—Y plane (Z-plane) which contains no Z-axis component corresponding to the etching direction. Therefore, the longitudinal direction of the microprobe portions or the electrode pad portions need not always be consistent with the X- or Y-direction. Further, the microprobe portions must only be formed corresponding to the positions and number of the electrode pads of the object of examination. Thus, the microprobe portions need not always be arranged corresponding to the four sides of the object.

Additional advantages and modifications will readily occur to those skilled in the art. Therefore, the invention in its broader aspects is not limited to the specific details, and representative devices, shown and described. Accordingly, departures may be made from such details without departing from the spirit or scope of the general inventive concept as defined by the appended claims and their equivalents.

What is claimed is:

1. A quartz probe apparatus comprising;
    a plurality of quartz probe bodies integrally formed from one quartz plate by etching a Z-plane of said quartz plate perpendicular to the crystal axis Z thereof, each quartz probe body incorporating a microprobe portion including:
    a number of microprobes corresponding to electrode arrays of an object of examination;
    a pattern wiring portion connected with the microprobe portion;
    an electrode pad portion connected with the pattern wiring portion; and
    a metal pattern layer formed on each side of each quartz probe body;
    wherein said quartz plate serves as a substrate for said quartz probe bodies during testing of said object of examination.

2. The quartz probe apparatus according to claim 1, wherein said etching is anisotropic etching.

3. The quartz probe apparatus according to claim 1, wherein said metal pattern layer has a multiple metla layer structure.

4. The quartz probe apparatus according to claim 3, wherein said multiple metal layer is formed of a primary layer and an electrically conductive layer.

5. The quartz probe apparatus according to claim 4, wherein said primary layer is formed of gold deposited on chromium.

6. The quartz probe apparatus according to claim 4, wherein said conductive layer is formed of a metal selected from the group consisting of gold, silver, copper, iridium, palladium, and platinum.

7. The quartz probe apparatus according to claim 3, wherein said multiple metal layer has a microstrip line structure.

8. The quartz probe apparatus according to claim 7, comprising a lead strip line formed on one side of the quartz plate, and a ground strip line formed on the other side of the quartz plate so as to correspond to the lead strip line.

9. The quartz probe apparatus according to claim 8, wherein said lead strip line and said ground strip line have the same pattern.

10. A quartz probe apparatus comprising:
    a plurality of quartz probe bodies formed by etching a Z-plane of a quartz plate perpendicular to the crystal axis Z thereof and integrally incorporating a microprobe portion including a number of microprobes corresponding to electrode arrays of an object of examination, a pattern wiring portion connected with the microprobe portion, and an electrode pad portion connected with the pattern wiring portion;
    a metal pattern layer formed on each said quartz probe body; and
    aligning means for aligning the electrode arrays on all sides of the object of examination and the microprobe portion;
    wherein said quartz plate serves as a substrate for said quartz probe bodies during testing of said object of examination.

11. The quartz probe apparatus according to claim 10, wherein said aligning means adjusts the positions of the quartz probe bodies through screw connections.

* * * * *